United States Patent
Gao et al.

(10) Patent No.: US 10,948,548 B2
(45) Date of Patent: Mar. 16, 2021

(54) METHOD AND APPARATUS FOR ESTIMATING BATTERY STATE OF HEALTH

(71) Applicant: Huawei Technologies Co., Ltd., Shenzhen (CN)

(72) Inventors: Kejie Gao, Shenzhen (CN); Zhongxiao Liu, Beijing (CN); Jianbo Zhang, Beijing (CN); Zhe Li, Beijing (CN); Zhiwei Wu, Shanghai (CN); Zuqi Liu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/657,651

(22) Filed: Oct. 18, 2019

(65) Prior Publication Data

US 2020/0049774 A1 Feb. 13, 2020

Related U.S. Application Data

(63) Continuation of application No. PCT/CN2017/087564, filed on Jun. 8, 2017.

(30) Foreign Application Priority Data

Apr. 18, 2017 (CN) .......................... 201710254759.6

(51) Int. Cl.
*G01R 31/36* (2020.01)
*G01R 31/392* (2019.01)
(Continued)

(52) U.S. Cl.
CPC ....... *G01R 31/392* (2019.01); *G01R 31/3648* (2013.01); *G01R 31/388* (2019.01); *H01M 10/48* (2013.01)

(58) Field of Classification Search
CPC . G01R 31/392; G01R 31/3648; G01R 31/382
See application file for complete search history.

(56) References Cited

U.S. PATENT DOCUMENTS 7,324,902 B2 1/2008 Verbrugge et al.
2012/0310561 A1 12/2012 Middleton et al.
(Continued)

FOREIGN PATENT DOCUMENTS

CN 102253343 A 11/2011
CN 102520361 A 6/2012
(Continued)

OTHER PUBLICATIONS

Qiang Zhu et al.,"A Review of the SoH Estimation Algorithms on Power Li-ion Battery for Electric Vehicles," 17th CCSSTA 2016, pp. 61-65 (2016). with English Abstract.
(Continued)

*Primary Examiner* — John E Breene
*Assistant Examiner* — Christine Y Liao
(74) *Attorney, Agent, or Firm* — Leydig, Voit & Mayer, Ltd.

(57) ABSTRACT

Estimating a battery state of health (SOH) is described. The state of heath is estimated by obtaining a partial charge or discharge capacity of a target battery in a state of charge (SOC) interval of each of a plurality of SOCs. First dV/dSOC data is separately calculated for each SOC in an $m^{th}$ preset battery capacity based on the $m^{th}$ preset battery capacity and the partial charge or discharge capacity in the SOC interval of each SOC. A smallest overall dV/dSOC data deviation is determined from all overall dV/dSOC data deviations corresponding to M preset battery capacities. A preset battery capacity is determined corresponding to the smallest overall dV/dSOC data deviation as a retention capacity of an aged target battery. The retention capacity of (Continued)

the aged target battery is divided by a retention capacity of the target battery in a new battery state, to obtain the SOH estimate of the target battery.

16 Claims, 5 Drawing Sheets

(51) Int. Cl.
*G01R 31/388* (2019.01)
*H01M 10/48* (2006.01)

(56) References Cited

U.S. PATENT DOCUMENTS

| | | | |
|---|---|---|---|
| 2013/0093430 A1* | 4/2013 | Hagimori | G01R 31/3835 |
| | | | 324/434 |
| 2015/0293183 A1 | 10/2015 | Tenmyo et al. | |
| 2015/0349385 A1* | 12/2015 | Hu | H01M 10/48 |
| | | | 429/91 |
| 2016/0187428 A1* | 6/2016 | Basu | G01R 31/367 |
| | | | 702/63 |
| 2018/0203071 A1* | 7/2018 | Takemura | H01M 4/5825 |

FOREIGN PATENT DOCUMENTS

| | | |
|---|---|---|
| CN | 102866361 A | 1/2013 |
| CN | 103197257 A | 7/2013 |
| CN | 103728563 A | 4/2014 |
| CN | 102540096 B | 7/2014 |
| CN | 104597404 A | 5/2015 |
| CN | 104635163 A | 5/2015 |
| CN | 105548900 A | 5/2016 |
| CN | 106371018 A | 2/2017 |
| EP | 0714033 A2 | 5/1996 |
| JP | 2014196995 A | 10/2014 |
| JP | 2016014588 A | 1/2016 |
| WO | 2013057784 A1 | 4/2013 |
| WO | 2014083856 A1 | 6/2014 |
| WO | 2016132813 A1 | 8/2016 |

OTHER PUBLICATIONS

Xue Li et al., "A capacity model based on charging process for state of health estimation of lithium ion batteries," Applied Energy 177, pp. 537-543 (2016).

Yuejiu Zheng et al., "LiFePO4 battery pack capacity estimation for electric vehicles based on charging cell voltage curve transformation," Journal of Power Sources 226, pp. 33-41 (2013).

* cited by examiner

METHOD AND APPARATUS FOR ESTIMATING BATTERY STATE OF HEALTH

CROSS-REFERENCE TO RELATED APPLICATIONS

This application is a continuation of International Patent Application No. PCT/CN2017/087564, filed on Jun. 8, 2017, which claims priority to Chinese Patent Application No. 201710254759.6, filed on Apr. 18, 2017. The disclosures of the aforementioned applications are hereby incorporated by reference in their entireties.

TECHNICAL FIELD

This application relates to the field of battery management technologies, and in particular, to a method and an apparatus for estimating a battery state of health (SOH).

BACKGROUND

With development of society, batteries are more widely used in various mobile or fixed devices, such as electric vehicles. A battery SOH is an important parameter for evaluating a battery management system. Therefore, how to estimate the battery SOH becomes a hot topic researched in industry.

In some current methods for estimating a battery SOH, a percentage of a retention capacity of an aged battery in a capacity of a battery in anew battery state is defined as a battery SOH. When the retention capacity of the aged battery is determined, the parameter usually can be obtained only by performing one full charge or full discharge test. However, in consideration of safe usage, the battery usually cannot be fully charged/fully discharged. In addition, due to a difference between individuals in a battery pack, it is more unable to ensure that all batteries are fully charged/fully discharged. Therefore, it is difficult to evaluate the battery SOH because the foregoing implementation condition for determining the retention capacity of the aged battery is relatively harsh.

SUMMARY

Embodiments of this application provide a method and an apparatus for estimating a battery SOH, to resolve a current problem that during evaluation of a battery SOH, it is difficult to evaluate the battery SOH because a retention capacity of an aged battery needs to be determined based on full charging/full discharging of a battery.

To achieve the foregoing objective, the embodiments of this application provide the following technical solutions:

According to a first aspect, an embodiment of this application provides a method for estimating a battery state of health (SOH). The method includes: obtaining a partial charge or discharge capacity of a target battery in a state of charge (SOC) interval of each of a plurality of states of charge (SOCs), where the SOC interval of each SOC is an interval whose start SOC is the SOC and whose length is dSOC; when determining that there are M preset battery capacities, separately calculating, according to steps S1 to S3, an overall dV/dSOC data deviation corresponding to each preset battery capacity, where M is a positive integer: S1. separately calculating first dV/dSOC data of each SOC in an $m^{th}$ preset battery capacity based on the $m^{th}$ preset battery capacity and the partial charge or discharge capacity in the SOC interval of each SOC, where m is a positive integer less than or equal to M; S2. separately calculating, based on a prestored dV/dSOC characteristic function, second dV/dSOC data corresponding to each SOC, where the dV/dSOC characteristic function is obtained by charging or discharging the target battery based on a preset current in a new battery state, the preset current is not greater than $\frac{1}{20} Q_{BOL}$, and $Q_{BOL}$ indicates a retention capacity of the target battery in the new battery state; and S3. calculating an $m^{th}$ overall dV/dSOC data deviation of the plurality of SOCs based on the first dV/dSOC data of each SOC in the $m^{th}$ preset battery capacity and the second dV/dSOC data corresponding to each SOC; determining a smallest overall dV/dSOC data deviation from all overall dV/dSOC data deviations; determining a preset battery capacity corresponding to the smallest overall dV/dSOC data deviation as a retention capacity of an aged target battery; and dividing the retention capacity of the aged target battery by the retention capacity of the target battery in the new battery state, to obtain an SOH of the target battery. In other words, in this solution, the retention capacity of the aged target battery is estimated based on the partial charge or discharge capacity in the SOC interval of each SOC. In this way, this solution is unlike the prior art in which the parameter can be obtained only by performing one full charge or full discharge test, and therefore an implementation condition of this solution is simpler and more flexible. In addition, this solution does not need to rely on historical data, and therefore is more robust.

In a possible design, the obtaining a partial charge or discharge capacity of a target battery in a SOC interval of each of a plurality of SOCs includes: obtaining the partial charge or discharge capacity of the target battery in the SOC interval of each of the plurality of SOCs with reference to the following first preset formula, where the first preset formula includes: $q_{SOC_n} = \eta \int_{SOC_n - t_{start}}^{SOC_n - t_{end}} i(t)_{SOC_n} dt$, where $SOC_n$ represents an $n^{th}$ SOC, $q_{SOC_n}$ represents a partial charge or discharge capacity in a SOC interval of $SOC_n$, $\eta$ is coulombic efficiency of the target battery, $0 < \eta \leq 1$, $SOC_n - t_{start}$ n start represents a start moment of the SOC interval of $SOC_n$, $SOC_n - t_{end}$ represents an end moment of the SOC interval of $SOC_n$, and $i(t)_{SOC_n}$ represents a random current in the SOC interval of $SOC_n$. Based on this solution, the partial charge or discharge capacity of the target battery in the SOC interval of each of the plurality of SOCs can be obtained.

In a possible design, the separately calculating first dV/dSOC data of each SOC in an $m^{th}$ preset battery capacity based on the $m^{th}$ preset battery capacity and the partial charge or discharge capacity in the SOC interval of each SOC includes: separately calculating the first dV/dSOC data of each SOC in the $m^{th}$ preset battery capacity based on the $m^{th}$ preset battery capacity and the partial charge or discharge capacity in the SOC interval of each SOC and with reference to a second preset formula, where the second preset formula includes:

$$g_1(SOC_n) = Q_m \left( \frac{dV}{dq} \right)_{SOC_n},$$

where $Q_m$ represents the $m^{th}$ preset battery capacity, $SOC_n$ represents the $n^{th}$ SOC, $g_1(SOC_n)$ represents first dV/dSOC data of $SOC_n$ in the $m^{th}$ preset battery capacity, V represents a voltage, q represents a partial charge or discharge capacity, and $\left(\frac{dV}{dq}\right)_{SOC_n}$ represents $\frac{dV}{dq}$ corresponding to $SOC_n$. Based on this solution, the first dV/dSOC data of each SOC in the $m^{th}$ preset battery capacity can be calculated.

In a possible design, when the target battery works in a discharge state, after the target battery is stable and static for a period of time, or a working condition of the target battery keeps at a very small current for a period of time, it can be considered that battery polarization disappears. In this case, a terminal voltage (V) of the target battery at an initial moment can be considered as an open circuit voltage (OCV) of the target battery at the initial moment. In addition, because an OCV-SOC curve is linear in a short period of time, it can be learned that dq is proportional to dOCV in a short period of time. Therefore, when the target battery works in the discharge state, the second preset formula specifically includes:

$$g_1(SOC_n) = Q_m \left(\frac{dV}{dq}\right)_{SOC_n} = Q_m \frac{OCV_{SOC_n-t_{end}} - OCV_{SOC_n-t_{start}}}{q'_{SOC_n}},$$

where $SOC_n$-$t_{start}$ represents the start moment of the SOC interval of $SOC_n$, $SOC_n$-$t_{end}$ represents the end moment of the SOC interval of $SOC_n$, $OCV_{SOC_n-t_{end}}$ represents an OCV at $SOC_n$-$t_{start}$, $OCV_{SOC_n-t_{start}}$ represents an OCV at $SOC_n$-$t_{end}$, and $q'_{SOC_n}$ represents a partial discharge capacity in the SOC interval of $SOC_n$.

In a possible design, the dV/dSOC characteristic function includes:

$$g_0(SOC_n) = a_0 + \sum_{j=1}^{6}(a_j * \sin(j*\omega*SOC_n) + b_j * \cos(j*\omega*SOC_n)),$$

where $SOC_n$ represents the $n^{th}$ SOC, $SOC_n$ is an independent variable of the dV/dSOC characteristic function, $g_0(SOC_n)$ represents second dV/dSOC data corresponding to $SOC_n$, j represents an order, $a_0$, $a_j$, and $b_j$ are coefficients of terms, sin( ) represents a sine function, cos( ) represents a cosine function, and ω represents frequency. The dV/dSOC characteristic function provided in this solution is a six-order Fourier function. To be specific, in this embodiment of this application, when the dV/dSOC characteristic function is fitted by using a fitting tool, the fitting is performed on a basis that the characteristic function is the six-order Fourier function. Certainly, in practice, the characteristic function may further include but is not limited only to a polynomial function, a Fourier function, an exponential function, and the like. This is not specifically limited in this embodiment of this application.

In a possible design, the calculating an $m^{th}$ overall dV/dSOC data deviation of the plurality of SOCs based on the first dV/dSOC data of each SOC in the $m^{th}$ preset battery capacity and the second dV/dSOC data corresponding to each SOC includes: calculating the $m^{th}$ overall dV/dSOC data deviation of the plurality of SOCs based on the first dV/dSOC data of each SOC in the $m^{th}$ preset battery capacity and the second dV/dSOC data corresponding to each SOC and with reference to a third preset formula, where the third preset formula includes:

$$G_m = \sum_{n=1}^{N}(g_0(SOC_n) - g_1(SOC_n))^2,$$

where N represents a quantity of SOCs, N is a positive integer not less than 2, $SOC_n$ represents the $n^{th}$ SOC, $g_0(SOC_n)$ represents the second dV/dSOC data corresponding to $SOC_n$, $g_1(SOC_n)$ represents the first dV/dSOC data of $SOC_n$ in the $m^{th}$ preset battery capacity, and $G_m$ represents the $m^{th}$ overall dV/dSOC data deviation of the plurality of SOCs. Based on this solution, the $m^{th}$ overall dV/dSOC data deviation of the plurality of SOCs can be calculated.

According to a second aspect, an embodiment of this application provides an apparatus for estimating a battery SOH. The apparatus for estimating a battery SOH has a function of implementing behavior in the foregoing method embodiment. The function may be implemented by hardware, or may be implemented by hardware by executing corresponding software. The hardware or the software includes one or more modules corresponding to the foregoing function.

According to a third aspect, an embodiment of this application provides an apparatus for estimating a battery SOH, including a processor, a memory, a bus, and a communications interface. The memory is configured to store a computer execution instruction. The processor is connected to the memory by using the bus. When the apparatus for estimating a battery SOH runs, the processor executes the computer execution instruction stored in the memory, so that the apparatus for estimating a battery SOH performs the method for estimating a battery SOH in any possible design of the first aspect.

According to a fourth aspect, an embodiment of this application provides a computer-readable storage medium, configured to store a computer software instruction used by the foregoing apparatus for estimating a battery SOH. When the computer software instruction runs on a computer, the computer can perform the method for estimating a battery SOH in any possible design of the first aspect.

According to a fifth aspect, an embodiment of this application provides a computer program product that includes an instruction. When the computer program product runs on a computer, the computer can perform the method for estimating a battery SOH in any possible design of the first aspect.

For technical effects brought by any design manner of the second to the fourth aspects, refer to technical effects brought by different design manners of the first aspect, and details are not described herein again.

According to a sixth aspect, an embodiment of this application discloses a method for estimating a battery state of health (SOH). The method includes:

obtaining N states of charge (SOCs) of a target battery in N states, where the SOC is a ratio of a remaining capacity of the target battery to a full charge capacity of the target battery; separately calculating first dV/dSOC data of each SOC in an $n^{th}$ state of charge based on a charge/discharge capacity of the target battery in the $n^{th}$ SOC and an $m^{th}$ preset capacity of the battery, where N represents a quantity of SOCs, N is a positive integer not less than 2, n is a positive integer less than or equal to N, m is a positive integer from 1 to M, and M is a quantity of preset capacities; separately calculating, based on a dV/dSOC-SOC characteristic function, second dV/dSOC data corresponding to each SOC, where the dV/dSOC-SOC characteristic function is obtained by charging or discharging the target battery based on a preset current in an new battery state, the preset current is not greater than 1/20 $Q_{BOL}$, and $Q_{BOL}$ indicates a retention capacity of the target battery in the new battery state; obtaining an $m^{th}$ overall dV/dSOC data deviation of the plurality of SOCs through calculation based on the first dV/dSOC data of each SOC in the $m^{th}$ preset battery capacity and the second dV/dSOC data corresponding to each SOC; determining a smallest overall dV/dSOC data deviation from M overall dV/dSOC data deviations; determining a preset battery capacity corresponding to the smallest overall dV/dSOC data deviation as a retention capacity of an aged target battery; and obtaining an SOH of the target battery through calculation based on the retention capacity of the aged target battery. In this way, this solution is unlike the prior art in which the parameter can be obtained only by performing one full charge or full discharge test, and therefore an implementation condition of this solution is simpler and more flexible. In addition, this solution does not need to rely on historical data, and therefore is more robust.

With reference to the sixth aspect, it should be noted that the obtaining an SOH of the target battery through calculation based on the retention capacity of the aged target battery includes: dividing the retention capacity of the aged target battery by the retention capacity of the target battery in the new battery state, to obtain the SOH of the target battery.

With reference to the sixth aspect, in a possible design, the method further includes: obtaining a partial charge or discharge capacity of the target battery in a SOC interval of each SOC in the $n^{th}$ SOC, where the SOC interval of each SOC is an interval whose start SOC is the SOC and whose length is dSOC, and the charge/discharge capacity in the $n^{th}$ SOC is a partial charge or discharge capacity in the interval.

Specifically, the obtaining a partial charge or discharge capacity of the target battery in a SOC interval of each SOC in the $n^{th}$ SOC includes:

obtaining the partial charge or discharge capacity of the target battery in the SOC interval of each of the plurality of SOCs with reference to the following first preset formula, where the first preset formula includes:

$q_{SOC_n} = \eta \int_{SOC_n-t_{start}}^{SOC_n-t_{end}} i(t) SOC_n dt$, where $SOC_n$ represents the $n^{th}$ SOC, $q_{SOC}$ represents a partial charge or discharge capacity in a SOC interval of $SOC_n$, $\eta$ is coulombic efficiency of the target battery, $0<\eta\le 1$, $SOC_n-t_{start}$ represents a start moment of the SOC interval of $SOC_n$, $SOC_n-t_{end}$ represents an end moment of the SOC interval of $SOC_n$, and $i(t)_{SOC_n}$ represents a random current in the SOC interval of $SOC_n$.

With reference to the sixth aspect, the separately calculating first dV/dSOC data of each SOC in an $n^{th}$ state of charge based on a charge/discharge capacity of the target battery in the $n^{th}$ SOC and an $m^{th}$ preset capacity of the battery includes:

separately calculating the first dV/dSOC data of each SOC in the $m^{th}$ preset battery capacity based on the $m^{th}$ preset battery capacity and the partial charge or discharge capacity in the SOC interval of each SOC and with reference to a second preset formula, where the second preset formula includes:

$$g_1(SOC_n) = Q_m \left(\frac{dV}{dq}\right)_{SOC_n},$$

where $Q_m$ represents the $m^{th}$ preset battery capacity, $SOC_n$ represents the $n^{th}$ SOC, $g_1(SOC_n)$ represents first dV/dSOC data of $SOC_n$ in the $m^{th}$ preset battery capacity, V represents a voltage, q represents a partial charge or discharge capacity, and $$\left(\frac{dV}{dq}\right)_{SOC_n}$$

represents $$\frac{dV}{dq}$$

corresponding to $SOC_n$.

When the target battery works in a discharge state, the second preset formula specifically includes:

$$g_1(SOC_n) = Q_m \left(\frac{dV}{dq}\right)_{SOC_n} = Q_m \frac{OCV_{SOC_n-t_{end}} - OCV_{SOC_n-t_{start}}}{q'_{SOC_n}},$$

where $SOC_n-t_{start}$ represents the start moment of the SOC interval of $SOC_n$, $SOC_n-t_{end}$ represents the end moment of the SOC interval of $SOC_n$, $OCV_{SOC_n-t_{end}}$ represents an OCV at $SOC_n-t_{start}$, $OCV_{SOC_n-t_{start}}$ represents an OCV at $SOC_n-t_{end}$, and $q'_{SOC_n}$ represents a partial discharge capacity in the SOC interval of $SOC_n$.

In addition, it should be noted that the dV/dSOC-SOC characteristic function includes:

$$g_0(SOC_n) = a_0 + \sum_{j=1}^{6} (a_j * \sin(j * \omega * SOC_n) + b_j * \cos(j * \omega * SOC_n)),$$

where $SOC_n$ represents the $n^{th}$ SOC, $SOC_n$ is an independent variable of the dV/dSOC-SOC characteristic function, $g_0(SOC_n)$ represents second dV/dSOC data corresponding to $SOC_n$, j represents an order, $a_0$, $a_j$, and $b_j$ are coefficients of terms, sin( ) represents a sine function, cos( ) represents a cosine function, and $\omega$ represents frequency.

With reference to the sixth aspect, it should be noted that the calculating an $m^{th}$ overall dV/dSOC data deviation of the plurality of SOCs based on the first dV/dSOC data of each SOC in the $m^{th}$ preset battery capacity and the second dV/dSOC data corresponding to each SOC includes:

calculating the $m^{th}$ overall dV/dSOC data deviation of the plurality of SOCs based on the first dV/dSOC data of each SOC in the $m^{th}$ preset battery capacity and the second dV/dSOC data corresponding to each SOC and with reference to a third preset formula, where the third preset formula includes:

$$G_m = \sum_{n=1}^{N} (g_0(SOC_n) - g_1(SOC_n))^2,$$

where N represents the quantity of SOCs, N is a positive integer not less than 2, $SOC_n$ represents the $n^{th}$ SOC, $g_0(SOC_n)$ represents the second dV/dSOC data corresponding to $SOC_n$, $g_1(SOC_n)$ represents the first dV/dSOC data of $SOC_n$ in the $m^{th}$ preset battery capacity, and $G_m$ represents the $m^{th}$ overall dV/dSOC data deviation of the plurality of SOCs.

According to a seventh aspect, an embodiment of the present invention discloses an apparatus for estimating a battery state of health (SOH). The apparatus includes an obtaining module and a calculation module, where the obtaining module obtains N states of charge (SOCs) of a target battery in N states, where the SOC is a ratio of a remaining capacity of the target battery to a full charge capacity of the target battery; and the calculation module is configured to: separately calculate first dV/dSOC data of each SOC in an $n^{th}$ state of charge based on a charge/discharge capacity of the target battery in the $n^{th}$ SOC and an $m^{th}$ preset capacity of the battery, where N represents a quantity of SOCs, N is a positive integer not less than 2, n is a positive integer less than or equal to N, m is a positive integer from 1 to M, and M is a quantity of preset capacities;

separately calculate, based on a dV/dSOC-SOC characteristic function, second dV/dSOC data corresponding to each SOC, where the dV/dSOC-SOC characteristic function is obtained by charging or discharging the target battery based on a preset current in an new battery state, the preset current is not greater than $1/20$ $Q_{BOL}$, and $Q_{BOL}$ indicates a retention capacity of the target battery in the new battery state;

obtain an $m^{th}$ overall dV/dSOC data deviation of the plurality of SOCs through calculation based on the first dV/dSOC data of each SOC in the $m^{th}$ preset battery capacity and the second dV/dSOC data corresponding to each SOC;

determine a smallest overall dV/dSOC data deviation from M overall dV/dSOC data deviations;

determine a preset battery capacity corresponding to the smallest overall dV/dSOC data deviation as a retention capacity of an aged target battery; and obtain an SOH of the target battery through calculation based on the retention capacity of the aged target battery.

Optionally, the calculation module is specifically configured to divide the retention capacity of the aged target battery by the retention capacity of the target battery in the new battery state, to obtain the SOH of the target battery.

With reference to the seventh aspect, the obtaining module is further configured to obtain a partial charge or discharge capacity of the target battery in a SOC interval of each SOC in the $n^{th}$ SOC, where the SOC interval of each SOC is an interval whose start SOC is the SOC and whose length is dSOC, and the charge/discharge capacity in the $n^{th}$ SOC is a partial charge or discharge capacity in the interval.

With reference to the seventh aspect, optionally, the obtaining module is specifically configured to:

obtain the partial charge or discharge capacity of the target battery in the SOC interval of each of the plurality of SOCs with reference to the following first preset formula, where the first preset formula includes:

$q_{SOC_n} = \eta \int_{SOC_n-t_{start}}^{SOC_n-t_{end}} i(t)_{SOC_n} dt$, where $SOC_n$ represents the $n^{th}$ SOC, $q_{SOC_n}$ represents a partial charge or discharge capacity in a SOC interval of $SOC_n$, $\eta$ is coulombic efficiency of the target battery, $0 < \eta \leq 1$, $SOC_n-t_{start}$ represents a start moment of the SOC interval of $SOC_n$, $SOC_n-t_{end}$ represents an end moment of the SOC interval of $SOC_n$, and $i(t)_{SOC_n}$ represents a random current in the SOC interval of $SOC_n$.

With reference to the seventh aspect, optionally, the calculation module is specifically configured to:

separately calculate the first dV/dSOC data of each SOC in the $m^{th}$ preset battery capacity based on the $m^{th}$ preset battery capacity and the partial charge or discharge capacity in the SOC interval of each SOC and with reference to a second preset formula, where the second preset formula includes:

$$g_1(SOC_n) = Q_m \left(\frac{dV}{dq}\right)_{SOC_n},$$

where $Q_m$ represents the $m^{th}$ preset battery capacity, $SOC_n$ represents the $n^{th}$ SOC, $g_1(SOC_n)$ represents first dV/dSOC data of $SOC_n$ in the $m^{th}$ preset battery capacity, V represents a voltage, q represents a partial charge or discharge capacity, and $$\left(\frac{dV}{dq}\right)_{SOC_n}$$

represents $$\frac{dV}{dq}$$

corresponding to $SOC_n$.

It should be noted that, when the target battery works in a discharge state, the second preset formula specifically includes:

$$g_1(SOC_n) = Q_m\left(\frac{dV}{dq}\right)_{SOC_n} = Q_m \frac{OCV_{SOC_n-t_{end}} - OCV_{SOC_n-t_{start}}}{q'_{SOC_n}},$$

where $SOC_n-t_{start}$ represents the start moment of the SOC interval of $SOC_n$, $SOC_n-t_{end}$ represents the end moment of the SOC interval of $SOC_n$, $OCV_{SOC_n-t_{end}}$ represents an OCV at $SOC_n-t_{start}$, $OCV_{SOC_n-t_{start}}$ represents an OCV at $SOC_n-t_{end}$, and $q'_{SOC_n}$ represents a partial discharge capacity in the SOC interval of $SOC_n$.

With reference to the seventh aspect, it should be noted that the dV/dSOC-SOC characteristic function includes:

$$g_0(SOC_n) = a_0 + \sum_{j=1}^{6}(a_j * \sin(j*\omega*SOC_n) + b_j * \cos(j*\omega*SOC_n)),$$

where $SOC_n$ represents the $n^{th}$ SOC, $SOC_n$ is an independent variable of the dV/dSOC-SOC characteristic function, $g_0(SOC_n)$ represents second dV/dSOC data corresponding to $SOC_n$, j represents an order, $a_0$, $a_j$, and $b_j$ are coefficients of terms, sin( ) represents a sine function, cos( ) represents a cosine function, and $\omega$ represents frequency.

With reference to the seventh aspect, optionally, the calculation module is specifically configured to:

calculate the $m^{th}$ overall dV/dSOC data deviation of the plurality of SOCs based on the first dV/dSOC data of each SOC in the $m^{th}$ preset battery capacity and the second dV/dSOC data corresponding to each SOC and with reference to a third preset formula, where the third preset formula includes:

$$G_m = \sum_{n=1}^{N} (g_0(SOC_n) - g_1(SOC_n))^2,$$

where N represents the quantity of SOCs, N is a positive integer not less than 2, $SOC_n$ represents the $n^{th}$ SOC, $g_0(SOC_n)$ represents the second dV/dSOC data corresponding to $SOC_n$, $g_1(SOC_n)$ represents the first dV/dSOC data of $SOC_n$ in the $m^{th}$ preset battery capacity, and $G_m$ represents the $m^{th}$ overall dV/dSOC data deviation of the plurality of SOCs.

According to an eighth aspect, an embodiment of this application discloses an apparatus for estimating a battery SOH, including a processor, a memory, a bus, and a communications interface. The memory is configured to store a computer execution instruction. The processor is connected to the memory by using the bus. When the apparatus runs, the processor executes the computer execution instruction stored in the memory, so that the apparatus performs the method for estimating a battery SOH in the sixth aspect.

According to a ninth aspect, an embodiment of this application provides a computer-readable storage medium, configured to store a computer software instruction used by the foregoing apparatus for estimating a battery SOH. When the computer software instruction runs on a computer, the computer can perform the method for estimating a battery SOH in any possible design of the sixth aspect.

According to a tenth aspect, an embodiment of this application provides a computer program product that includes an instruction. When the computer program product runs on a computer, the computer can perform the method for estimating a battery SOH in any possible design of the sixth aspect.

These aspects or other aspects of this application are clearer and more comprehensible in descriptions of the following embodiments.

DESCRIPTION OF EMBODIMENTS

To facilitate understanding of the technical solutions in the embodiments of this application, explanations of several key terms are first provided as follows:

Retention capacity: a full charge or discharge capacity that is of a battery and that is obtained after the battery is used for a period of time or left unused for a long period of time.

Aging: a phenomenon that a battery capacity naturally attenuates when a battery is used for a period of time or left unused for a long period of time. Specifically, aging of a battery generally includes two parts: aging in a cycle process (namely, a cycle life), and aging in a process in which the battery is left unused (namely, a calendar life). The aging in the cycle process means that as a quantity of times of charging/discharging the battery increases, an available quantity of times that the battery can be charged/discharged decreases correspondingly, where a total quantity of times of charging/discharging the battery is measurable and can be estimated; and a retention capacity during each time of charging/discharging attenuates. The aging in the process in which the battery is left unused means that when the battery is not charged/discharged, a retention capacity of the battery attenuates with time. A form of the aging in the embodiments of this application is not limited. Uniform description is provided herein, and details are not described below again.

A new battery state (beginning of life, BOL) is specifically a battery state in which a retention capacity is 100%.

State of health (SOH): a percentage of a retention capacity of an aged battery in a capacity of a battery in a new battery state is defined as a battery SOH.

State of charge (SOC): the SOC is a ratio of a remaining capacity of a battery to a full charge capacity of the battery, and is usually expressed as a percentage.

Open circuit voltage (OCV): a terminal voltage of a battery in an open circuit state is referred to as the open circuit voltage.

Battery polarization: a phenomenon that an actual electrode potential deviates from a balanced electrode potential after a static state is broken due to current flow.

The following describes the technical solutions in the embodiments of this application with reference to the accompanying drawings in the embodiments of this application. In the descriptions of this application, unless otherwise stated, "/" indicates "or", for example, A/B may indicate A or B; and "and/or" in this specification describes merely an association relationship for describing associated objects, and indicates that three relationships may exist. For example, A and/or B may indicate the following three cases: Only A exists, both A and B exist, and only B exists. In addition, in the descriptions of this application, "a plurality of" means "two or more".

Figure 1:
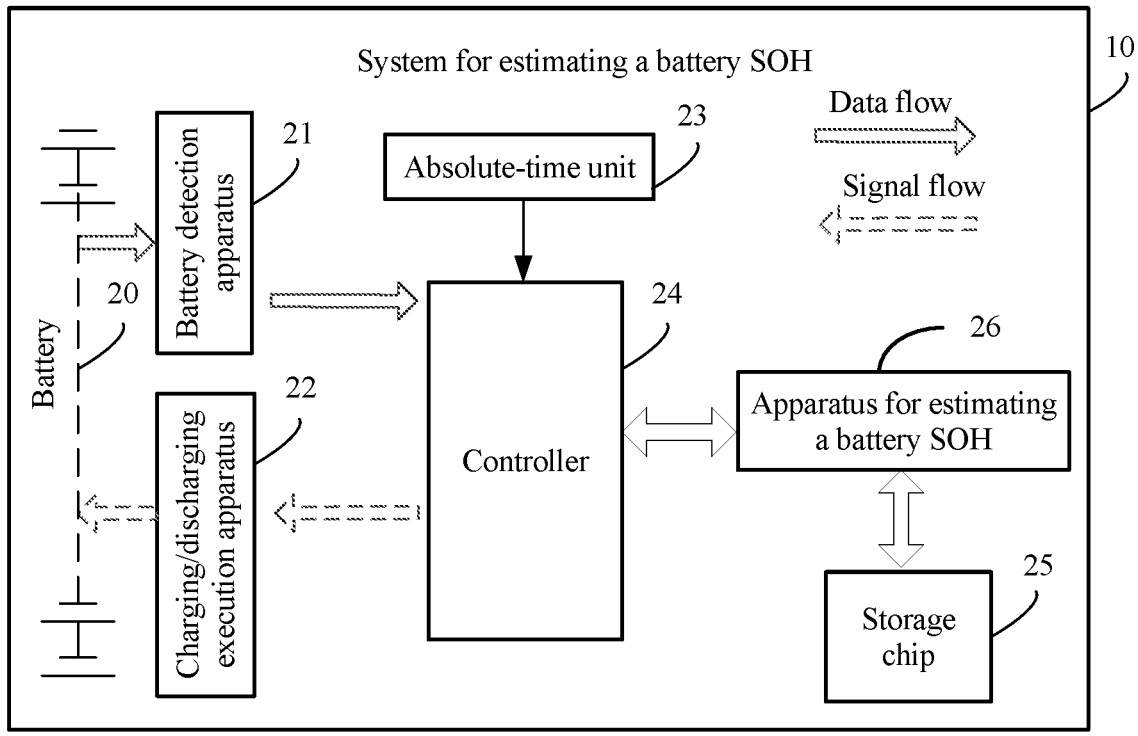
FIG. 1 is a schematic architectural diagram of a system for estimating a battery SOH according to an embodiment of this application.

FIG. 1 shows a system 10 for estimating a battery SOH according to an embodiment of this application. The system 10 for estimating a battery SOH includes a battery 20, a battery detection apparatus 21, a charging/discharging execution apparatus 22, an absolute-time unit 23, a controller 24, a storage chip 25, and an apparatus 26 for estimating a battery SOH.

The battery detection apparatus 21 is configured to upload data that is detected in real time to the controller. The battery detection apparatus 21 includes three parts: a battery voltage sampling component, a current sampling unit, and a temperature sampling component. The battery voltage sampling component includes a sampling chip and a connection bundle. The current sampling unit includes a current sampling chip and a current sensor. The temperature sampling component includes a temperature sampling chip and a temperature sensor.

The charging/discharging execution apparatus 22 is configured to charge/discharge the battery.

The absolute-time unit 23 is configured to send, to the controller 24 in real time, an absolute time provided by a high-frequency crystal oscillator.

The controller 24 is configured to: control sampling for the battery, receive the absolute time, and pack sampled data and the absolute time and then store the packed sampled data and absolute time in the storage chip 25; and control a charge/discharge current and a state of the battery by using the charging/discharging execution apparatus 22.

The storage chip 25 is configured to: prestore dV/dSOC-SOC information of a new battery, and store collected valid battery data in real time and in a particular format.

The apparatus 26 for estimating a battery SOH is configured to: perform an ordered storage and read operation on data in the storage chip 25, and estimate a battery SOH based on the read data. For a specific implementation, refer to the following method embodiment, and details are not described herein.

The system 10 for estimating a battery SOH may further include a power supply, a security protection apparatus, an insulation apparatus, and the like although they are not shown. This is not specifically limited in this embodiment of this application.

Figure 2:
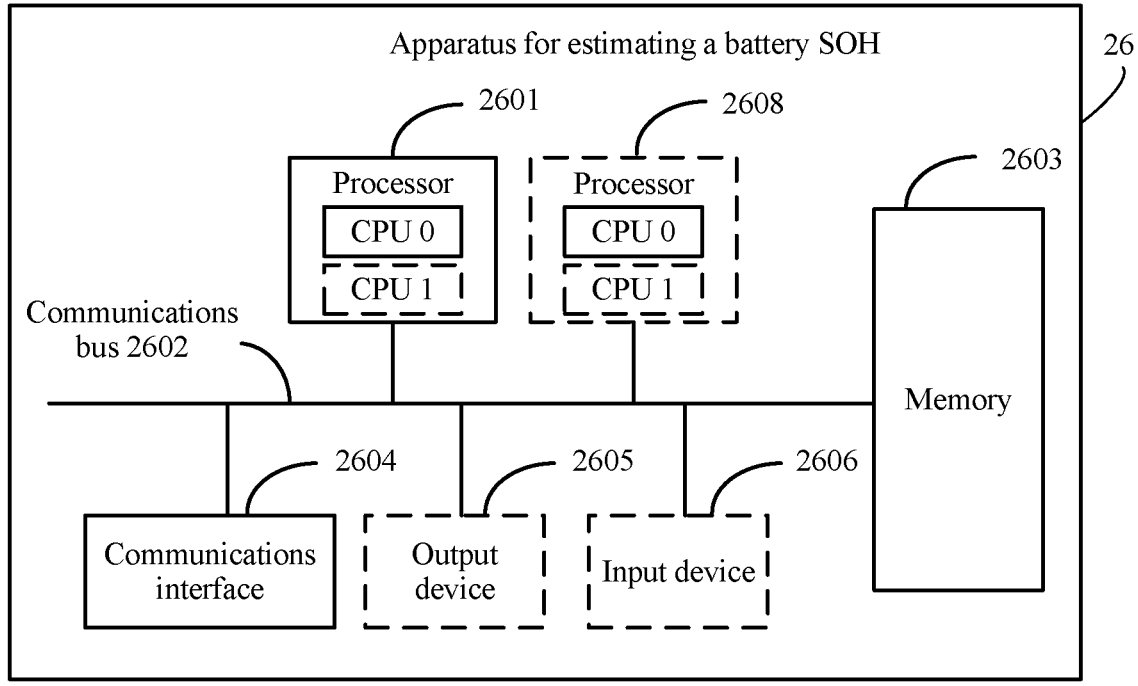
FIG. 2 is a schematic diagram of a hardware structure of an apparatus for estimating a battery SOH according to an embodiment of this application.

FIG. 2 is a schematic diagram of a hardware structure of an apparatus 26 for estimating a battery SOH according to an embodiment of this application. The apparatus 26 for estimating a battery SOH includes at least one processor 2601, a communications bus 2602, a memory 2603, and at least one communications interface 2604.

The processor 2601 may be a general-purpose central processing unit (CPU), a microprocessor, an application-specific integrated circuit (ASIC), or one or more integrated circuits configured to control program execution of the solutions in this application.

The communications bus 2602 may include a channel for transmitting information between the foregoing components.

The communications interface 2604 is configured to use any apparatus like a transceiver to communicate with another device or a communications network, such as the Ethernet, a radio access network (RAN), or a wireless local area network (WLAN).

The memory 2603 may be a read-only memory (ROM) or another type of static storage device capable of storing static information and instructions, or a random access memory (RAM) or another type of dynamic storage device capable of storing information and instructions, or may be an electrically erasable programmable read-only memory (EEPROM), a compact disc read-only memory (CD-ROM) or another compact disc storage, an optical disc storage (including a compressed optical disc, a laser disc, an optical disc, a digital versatile disc, a Blu-ray optical disc, and the like), a magnetic disk storage medium or another magnetic storage device, or any other medium capable of carrying or storing expected program code in a form of an instruction or a data structure and capable of being accessed by a computer. However, the memory 2603 is not limited thereto. The memory may exist independently, and is connected to the processor by using the bus. Alternatively, the memory may be integrated with the processor.

The memory 2603 is configured to store application program code for executing the solutions in this application, and the processor 2601 controls the execution. The processor 2601 is configured to execute the application program code stored in the memory 2603, to implement the method for estimating a battery SOH that is provided in the embodiments of this application.

During specific implementation, in an embodiment, the processor 2601 may include one or more CPUs, for example, a CPU 0 and a CPU 1 in FIG. 2.

During specific implementation, in an embodiment, the apparatus 26 for estimating a battery SOH may include a plurality of processors, for example, the processor 2601 and a processor 2608 in FIG. 2. Each of the processors may be a single-core (single-CPU) processor, or may be a multi-core (multi-CPU) processor. The processor herein may be one or more devices, circuits, and/or processing cores for processing data (e.g., a computer program instruction).

During specific implementation, in an embodiment, the apparatus 26 for estimating a battery SOH may further include an output device 2605 and an input device 2606. The output device 2605 communicates with the processor 2601, and can display information in a plurality of manners. For example, the output device 2605 may be a liquid crystal display (LCD), a light emitting diode (LED) display device, a cathode-ray tube (CRT) display device, or a projector. The input device 2606 communicates with the processor 2601, and can receive a user input in a plurality of manners. For example, the input device 2606 may be a mouse, a keyboard, a touchscreen device, or a sensing device.

Figure 3:
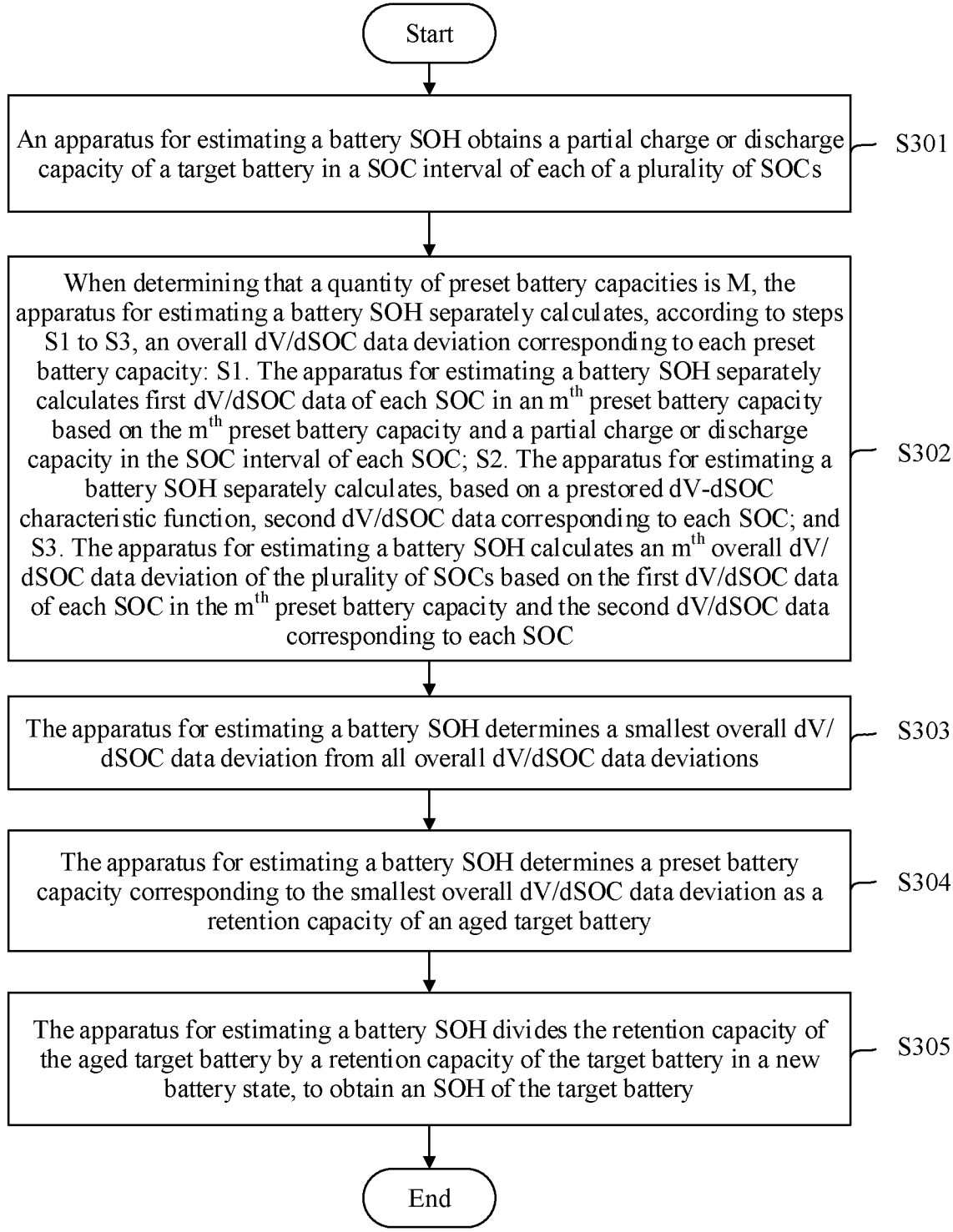
FIG. 3 is a schematic flowchart of a method for estimating a battery SOH according to an embodiment of this application.

FIG. 3 shows a method for estimating a battery SOH according to an embodiment of this application. The method includes the following steps.

S301. An apparatus for estimating a battery SOH obtains a partial charge or discharge capacity of a target battery in a SOC interval of each of a plurality of SOCs.

The SOC interval of each SOC is an interval whose start SOC is the SOC and whose length is dSOC.

S302. When determining that there are M preset battery capacities, the apparatus for estimating a battery SOH separately calculates, according to steps S1 to S3, an overall dV/dSOC data deviation corresponding to each preset battery capacity, where M is a positive integer.

S1. The apparatus for estimating a battery SOH separately calculates first dV/dSOC data of each SOC in an $m^{th}$ preset battery capacity based on the $m^{th}$ preset battery capacity and the partial charge or discharge capacity in the SOC interval of each SOC.

m is a positive integer less than or equal to M.

S2. The apparatus for estimating a battery SOH separately calculates, based on a prestored dV/dSOC characteristic function, second dV/dSOC data corresponding to each SOC.

The dV/dSOC characteristic function is obtained by charging or discharging the target battery based on a preset current in a new battery state, the preset current is not greater than 1/20 $Q_{BOL}$, and $Q_{BOL}$ indicates a retention capacity of the target battery in the new battery state.

S3. The apparatus for estimating a battery SOH calculates an $m^{th}$ overall dV/dSOC data deviation of the plurality of SOCs based on the first dV/dSOC data of each SOC in the $m^{th}$ preset battery capacity and the second dV/dSOC data corresponding to each SOC.

S303. The apparatus for estimating a battery SOH determines a smallest overall dV/dSOC data deviation from all overall dV/dSOC data deviations.

S304. The apparatus for estimating a battery SOH determines a preset battery capacity corresponding to the smallest overall dV/dSOC data deviation as a retention capacity of an aged target battery.

S305. The apparatus for estimating a battery SOH divides the retention capacity of the aged target battery by a retention capacity of the target battery in a new battery state, to obtain an SOH of the target battery.

In step S301:

The SOC interval of each SOC is an interval whose start SOC is the SOC and whose length is dSOC. For example, a SOC interval of a first SOC is an interval whose start SOC is the first SOC and whose length is dSOC. All SOCs intervals may have same dSOC, or may have different dSOC. This is not specifically limited in this embodiment of this application.

It should be noted that, for ease of representation, in this embodiment of this application, the first SOC is denoted as $SOC_1$, a second SOC is denoted as $SOC_2$, and an $n^{th}$ SOC is denoted as $SOC_n$. This is uniformly described herein, and details are not described below again.

Optionally, the obtaining, by an apparatus for estimating a battery SOH, a partial charge or discharge capacity of a target battery in a SOC interval of each of a plurality of SOCs may specifically include: obtaining, by the apparatus for estimating a battery SOH, the partial charge or discharge capacity of the target battery in the SOC interval of each of the plurality of SOCs with reference to formula (1). Formula (1) is as follows:

$$q_{SOC_n} = \eta \int_{SOC_n - t_{start}}^{SOC_n - t_{end}} i(t)_{SOC_n} dt \qquad \text{formula (1)}$$

$SOC_n$ represents the $n^{th}$ SOC. $q_{SOC_n}$ represents a partial charge or discharge capacity in a SOC interval of $SOC_n$. $\eta$ is coulombic efficiency of the target battery, $0 < \eta \le 1$, and $\eta$ may be given based on a battery type. For a lithium-ion battery, $\eta$ may be 1. For another type of battery such as a lead-acid battery, a NiMH battery, or a Ni—Cd battery, $\eta$ may be a value from 0.9 to 1 based on a different type. $SOC_n - t_{start}$ represents a start moment of the SOC interval of $SOC_n$. $SOC_n - t_{end}$ represents an end moment of the SOC interval of $SOC_n$. $i(t)_{SOC_n}$ represents a random current in the SOC interval of $SOC_n$.

For example, when the target battery works in a charge state, for the SOC interval of each SOC, when a charge current of the target battery is less than a preset value, for example, when in a large-current charge process, a current in an initial charge phase and a current in an end charge phase are controlled to be less than 1/20 $Q_{BOL}$, or a current in the entire charge process is controlled to be less than 1/20 $Q_{BOL}$, the battery detection apparatus 21 in FIG. 1 may flush all collected data into the storage chip 25 in a form of a structure array. The structure includes several array elements, such as a voltage, a current, a temperature, an absolute time, and an initial SOC, and may be specifically represented as Data (k) {VII, I[ ], Temp[ ], Time[ ], SOC[ ]}, where k is a natural number from 0 to K and represents K pieces of structure data. Recording frequency is recorded based on sampling frequency, and recording duration is $\Delta t = t_{end} - t_{start}$. Then, the apparatus for estimating a battery SOH may read the foregoing structure data from the storage chip 25, and then obtain a partial charge capacity of the target battery in the SOC interval of each of the plurality of SOCs with reference to formula (1).

For example, when the target battery works in a discharge state, for the SOC interval of each SOC, when the target battery is in an approximate open-circuit stable state, the battery detection apparatus 21 in FIG. 1 may flush all collected data into the storage chip 25 in a form of a structure array. The structure includes several array elements, such as a voltage, a current, a temperature, an absolute time, and an initial SOC, and may be specifically represented as Data (k) {V[ ], Temp[ ], Time[ ], SOC[ ]}, where k is a natural number from 0 to K and represents K pieces of structure data. Recording frequency is recorded based on sampling frequency, and recording duration is $\Delta t = t_{end} - t_{start}$. Then, the apparatus for estimating a battery SOH may read the foregoing structure data from the storage chip 25, and then obtain a partial discharge capacity of the target battery in the SOC interval of each of the plurality of SOCs with reference to formula (1). In this embodiment of this application, if a current value I of the target battery is greater than $-\beta$ and is less than $\beta$ and this lasts $\gamma$ minutes, or the target battery is left unused in an open circuit for more than 15 minutes, it is considered that the target battery reaches the approximate open-circuit stable state. Values of $\beta$ and $\gamma$ are determined based on a characteristic of the target battery. Generally, $\beta$ is 2 A, and $\gamma$ is 5 to 10 minutes.

For example, for $SOC_1$, the apparatus for estimating a battery SOH may read K pieces of structure data in a SOC interval of $SOC_1$ from the storage chip 25, and obtain a partial charge or discharge capacity in the SOC interval of $SOC_1$ according to formula (1). The partial charge or discharge capacity in the SOC interval of $SOC_1$ is as follows:

$$q_{SOC_1} = \eta \int_{SOC_1 - t_{start}}^{SOC_1 - t_{end}} i(t)_{SOC_1} dt = \eta \sum_{k=0}^{K} I[k]_{SOC_1}$$

It should be noted that in this embodiment of this application, a value of K depends on an absolute time t, an absolute time $t_{start}$ is an absolute moment at which data is recorded at the beginning of an algorithm, an absolute time $t_{end}$ is an absolute moment at which an SOH starts to be estimated at the end of the algorithm, and a time difference between $t_{start}$ and $t_{end}$ is usually not more than one month. In addition, the value of K cannot exceed a preset upper limit value. For example, the preset upper limit value is 100, and this indicates that data recording is performed for a maximum of one hundred times. The preset upper limit value may be determined based on a size of the storage chip 25. When storage permission is met, a larger preset upper limit value indicates a larger amount of data participating in estimation and higher estimation accuracy.

In S1 of step S302:

Optionally, the separately calculating, by the apparatus for estimating a battery SOH, first dV/dSOC data of each SOC in an $m^{th}$ preset battery capacity based on the $m^{th}$ preset battery capacity and the partial charge or discharge capacity in the SOC interval of each SOC may specifically include: separately calculating, by the apparatus for estimating a battery SOH, the first dV/dSOC data of each SOC in the $m^{th}$ preset battery capacity based on the $m^{th}$ preset battery capacity and the partial charge or discharge capacity in the SOC interval of each SOC and with reference to formula (2). Formula (2) is as follows:

$$g_1(SOC_n) = Q_m \left( \frac{dV}{dq} \right)_{SOC_n} \qquad \text{formula (2)}$$

$Q_m$ represents the $m^{th}$ preset battery capacity, $SOC_n$ represents the $n^{th}$ SOC, $g_1(SOC_n)$ represents first dV/dSOC data of $SOC_n$ in the $m^{th}$ preset battery capacity, V represents a voltage, q represents a partial charge or discharge capacity, and $$\left( \frac{dV}{dq} \right)_{SOC_n}$$

represents $$\frac{dV}{dq}$$

corresponding to $SOC_n$.

For example, assuming that the apparatus for estimating a battery SOH can read K pieces of structure data in the SOC interval of $SOC_n$ from the storage chip 25, because a V-SOC curve is linear in a short period of time, the apparatus for estimating a battery SOH may calculate the first dV/dSOC data of $SOC_n$ in the $m^{th}$ preset battery capacity according to formula (2). The first dV/dSOC data of $SOC_n$ in the $m^{th}$ preset battery capacity is as follows:

$$g_1(SOC_n) =$$
$$Q_m \left( \frac{dV}{dq} \right)_{SOC_n} = Q_m \frac{V_{SOC_n-t_{end}} - V_{SOC_n-t_{start}}}{q_{SOC_n}} = Q_m \frac{V[K]_{SOC_n} - V[0]_{SOC_n}}{q_{SOC_n}}$$

$SOC_n-t_{start}$ represents the start moment of the SOC interval of $SOC_n$, $SOC_n-t_{end}$ represents the end moment of the SOC interval of $SOC_n$, $V_{SOC_n-t_{end}}$ represents a voltage at $SOC_n-t_{end}$, $V_{SOC_n-t_{start}}$ represents a voltage at $SOC_n-t_{start}$, $V[K]_{SOC_n}$ represents a $K^{th}$ voltage in the SOC interval of $SOC_n$, and $V[0]_{SOC_n}$ represents an initial voltage in the SOC interval of $SOC_n$.

Optionally, when the target battery works in a discharge state, after the target battery is stable and static for a period of time, or a working condition of the target battery keeps at a very small current for a period of time, it can be considered that battery polarization disappears. In this case, a terminal voltage V of the target battery at an initial moment can be considered as an OCV of the target battery at the initial moment. In addition, because an OCV-SOC curve is linear in a short period of time, it can be learned that dq is proportional to dOCV in a short period of time. Therefore, when the target battery works in the discharge state, the foregoing formula (2) can be evolved into the following formula (3):

$$g_1(SOC_n) = \qquad \text{formula (3)}$$
$$Q_m \left( \frac{dV}{dq} \right)_{SOC_n} = Q_m \frac{OCV_{SOC_n-t_{end}} - OCV_{SOC_n-t_{start}}}{q'_{SOC_n}}$$

$OCV_{SOC_n-t_{end}}$ represents an OCV at $SOC_n-t_{start}$, $OCV_{SOC_n-t_{start}}$ represents an OCV at $SOC_n-t_{end}$, and $q'_{SOC_n}$ represents a partial discharge capacity in the SOC interval of $SOC_n$.

Optionally, the apparatus for estimating a battery SOH may determine $OCV_{t_{end}}$ and $OCV_{t_{start}}$ based on a start SOC and an end SOC of the SOC interval of $SOC_n$ and with reference to a prestored correspondence between a SOC and an OCV. This is not specifically limited in this embodiment of this application.

For example, assuming that the apparatus for estimating a battery SOH can read the K pieces of structure data in the SOC interval of $SOC_n$ from the storage chip 25, the apparatus for estimating a battery SOH may calculate the first dV/dSOC data in the $m^{th}$ preset battery capacity according to formula (3). The first dV/dSOC data in the $m^{th}$ preset battery capacity is as follows:

$$g_1(SOC_n) = Q_m \left( \frac{dV}{dq} \right)_{SOC_n} =$$
$$Q_m \frac{OCV_{SOC_n-t_{end}} - OCV_{SOC_n-t_{start}}}{q'_{SOC_n}} Q_m \frac{OCV[K]_{SOC_n} - OCV[0]_{SOC_n}}{q'_{SOC_n}}$$

$OCV[K]_{SOC_n}$ represents a $K^{th}$ OCV in the SOC interval of $SOC_n$, and $OCV[0]_{SOC_n}$ represents an initial OCV in the SOC interval of $SOC_n$. $OCV[K]_{SOC_n}$ can be determined based on $SOC_n[K]$ and the prestored correspondence between a SOC and an OCV, and $OCV[0]_{SOC_n}$ can be determined based on $SOC_n[0]$ and the prestored correspondence between a SOC and an OCV. $SOC_n[K]$ represents a $K^{th}$ SOC in the SOC interval of $SOC_n$, and $SOC_n[0]$ represents an initial SOC in the SOC interval of $SOC_n$.

In S2 of step S302:

That the apparatus for estimating a battery SOH separately calculates, based on a prestored dV/dSOC characteristic function, second dV/dSOC data corresponding to each SOC is specifically that the apparatus for estimating a battery SOH separately substitutes each SOC to the prestored dV/dSOC characteristic function to obtain the second dV/dSOC data corresponding to each SOC.

Optionally, the prestored dV/dSOC characteristic function may be obtained in the following manner:

Step 1: Charge or discharge the target battery based on a preset current in a new battery state, to obtain a voltage-capacity curve.

The preset current is not greater than 1/20 $Q_{BOL}$. For example, the preset current is 1/25 $Q_{BOL}$.

Figure 4:
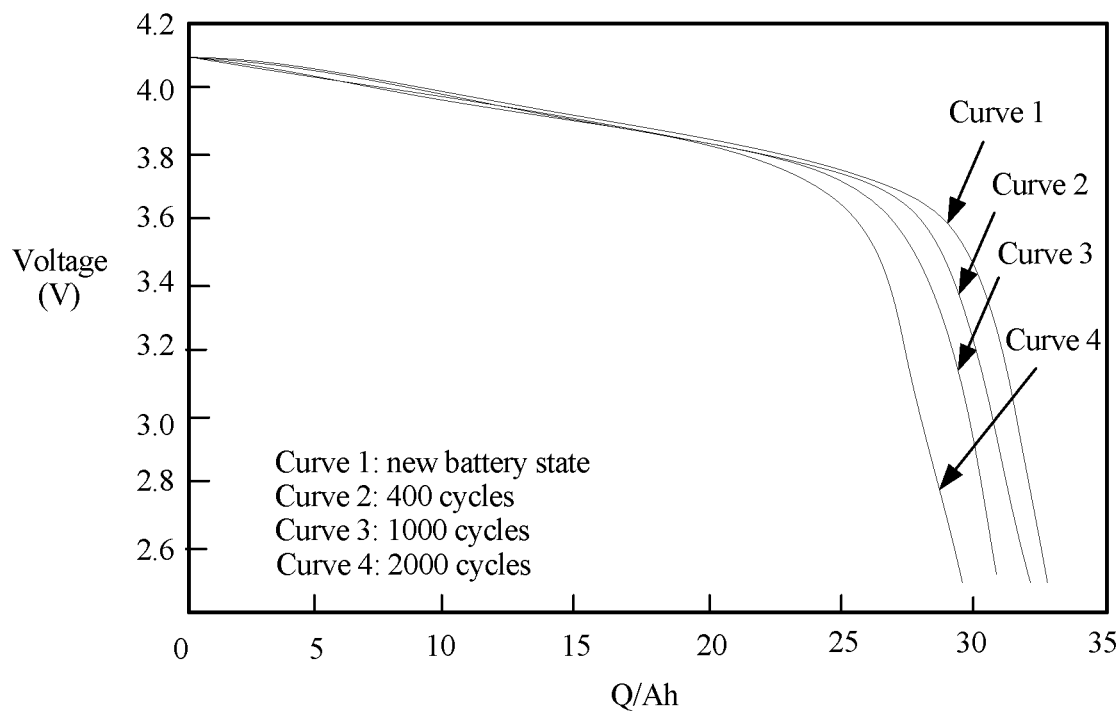
FIG. 4 is a voltage-capacity line graph of charging or discharging a target battery based on a preset current in a new battery state and at different aging degrees according to an embodiment of this application.

For example, FIG. 4 is a voltage-capacity (V-Q) line graph of charging or discharging the target battery based on the preset current in the new battery state and at different aging degrees according to this embodiment of this application. A curve 1 is a V-Q line graph of charging or discharging the target battery based on the preset current in the new battery state. A curve 2 is a V-Q line graph of charging or discharging the target battery based on the preset current at an aging degree of 400 cycles. A curve 3 is a V-Q line graph of charging or discharging the target battery based on the preset current at an aging degree of 1000 cycles. A curve 4 is a V-Q line graph of charging or discharging the target battery based on the preset current at an aging degree of 2000 cycles. It can be seen from FIG. 4 that a capacity that can be released by the target battery decreases gradually as an aging degree increases, in other words, as a quantity of cycle times increases, and V-Q curves have an obvious deviation at the end of discharging.

It should be noted that, because a voltage in a small-current condition very approximates to an OCV, the voltage-capacity curve in this embodiment of this application very approximates to an existing OCV-capacity curve. This is uniformly described herein, and details are not described below again.

Step 2: Convert the voltage-capacity curve into a voltage-state of charge (V-SOC) curve.

A charge/discharge capacity of the target battery is converted into a ratio of a remaining capacity of the target battery to a full charge capacity of the target battery based on the voltage-capacity curve obtained in step 1 and according to a definition of the SOC, to obtain the V-SOC curve.

Figure 5:
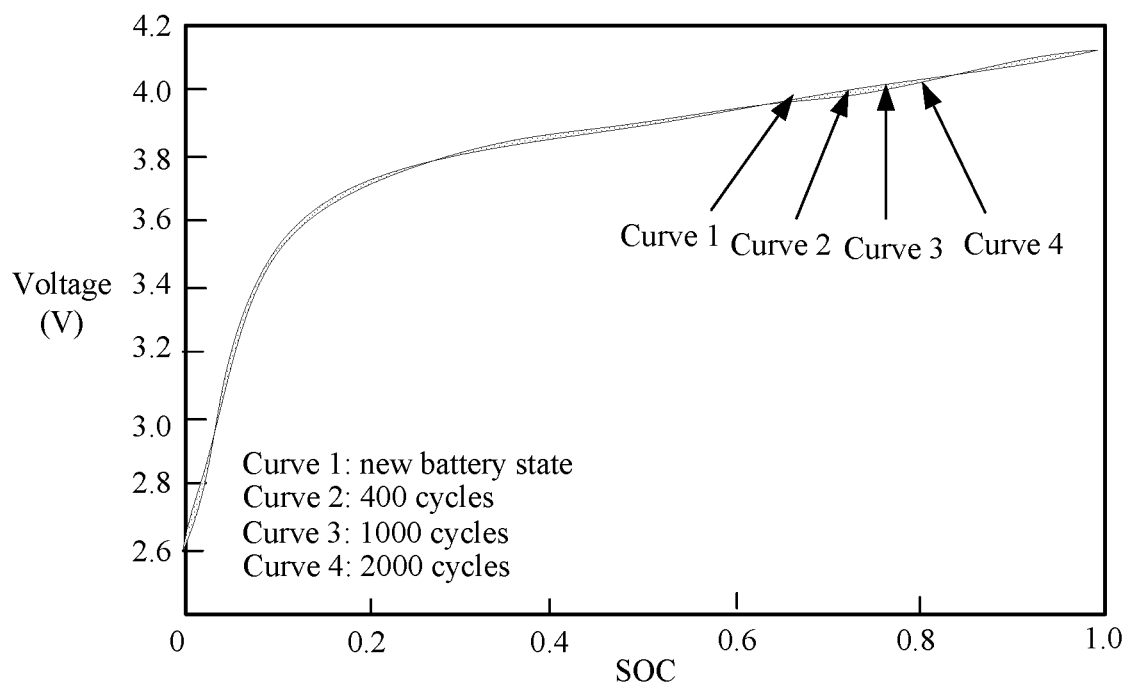
FIG. 5 is a V-SOC line graph, corresponding to FIG. 4, of charging or discharging a target battery based on a preset current in a new battery state and at different aging degrees according to an embodiment of this application.

For example, FIG. 5 is a V-SOC line graph, corresponding to FIG. 4, of charging or discharging the target battery based on the preset current in the new battery state and at the different aging degrees. It can be seen from FIG. 5 that, when charging or discharging is performed based on the preset current, V-SOC curves at different aging degrees present a normalization characteristic. In this embodiment of this application, the battery SOH is estimated based on this normalization characteristic.

Step 3: Obtain a dV/dSOC characteristic curve of the target battery based on the V-SOC curve.

Figure 6:
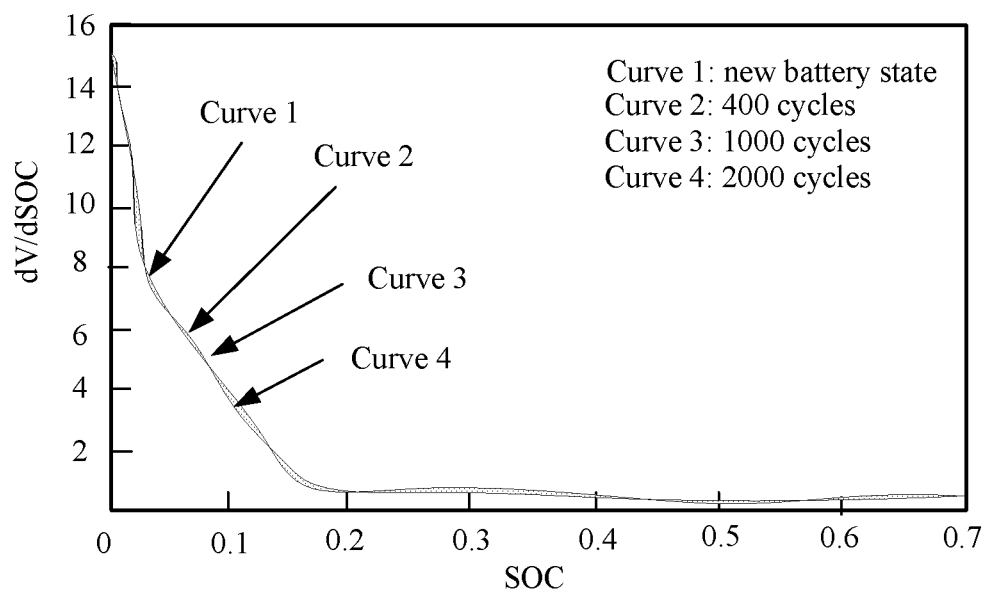
FIG. 6 shows dV/dSOC characteristic curves of charging or discharging a target battery based on a preset current in a new battery state and at different aging degrees according to an embodiment of this application.

For example, dV/dSOC characteristic curves of charging or discharging the target battery based on the preset current in the new battery state and at the different aging degrees may be shown in FIG. 6.

Step 4: Extract points on the dV/dSOC characteristic curve for fitting, to obtain the dV/dSOC characteristic function of the target battery in the new state.

For example, points in an interval with a highest curve normalization degree in FIG. 6 may be selected for fitting. For example, points in a SOC interval from 0 to 0.7 are selected for fitting.

When charging or discharging is performed based on the preset current, the V-SOC curves at the different aging degrees present the normalization characteristic. Therefore, when charging or discharging is performed based on the preset current, the dV/dSOC characteristic function that is of the target battery in the new state and that is obtained by charging or discharging the target battery based on the preset current in the new battery state may also be considered as a dV/dSOC characteristic function of the target battery at the different aging degrees.

For example, the dV/dSOC characteristic function may be shown as formula (4):

$$g_0(SOC_n) = a_0 + \sum_{j=1}^{6}(a_j * \sin(j*\omega*SOC_n) + b_j * \cos(j*\omega*SOC_n)) \quad \text{formula (4)}$$

The characteristic function is a six-order Fourier function. $SOC_n$ is an independent variable of the dV/dSOC characteristic function. $g_0(SOC_n)$ represents second dV/dSOC data corresponding to $SOC_n$. j represents an order, $a_0$, $a_j$, and $b_j$ are coefficients of terms, and the order and the coefficients are all obtained by using a fitting tool. sin( ) represents a sine function. cos( ) represents a cosine function. ω represents frequency.

Figure 7:
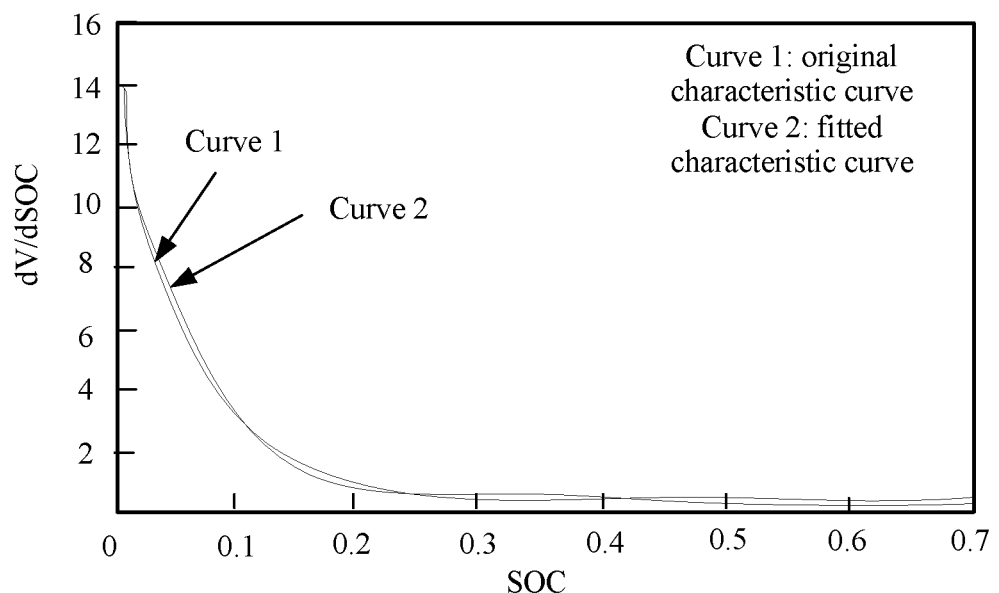
FIG. 7 is a schematic diagram of comparing a fitted curve with an actual curve according to an embodiment of this application.

FIG. 7 is a schematic diagram of comparing a fitted curve corresponding to the dV/dSOC characteristic function shown in formula (4) with an original dV/dSOC characteristic curve, and the two curves basically coincide.

Optionally, in this embodiment of this application, when the dV/dSOC characteristic function is fitted by using a fitting tool, the fitting is performed by using an example in which the characteristic function is the six-order Fourier function. Certainly, in practice, the characteristic function may further include but is not limited only to a polynomial function, a Fourier function, an exponential function, and the like. This is not specifically limited in this embodiment of this application.

In S3 of step S302:

Optionally, the calculating, by the apparatus for estimating a battery SOH, an $m^{th}$ overall dV/dSOC data deviation of the plurality of SOCs based on the first dV/dSOC data of each SOC in the $m^{th}$ preset battery capacity and the second dV/dSOC data corresponding to each SOC specifically includes: calculating, by the apparatus for estimating a battery SOH, the $m^{th}$ overall dV/dSOC data deviation of the plurality of SOCs based on the first dV/dSOC data of each SOC in the $m^{th}$ preset battery capacity and the second dV/dSOC data corresponding to each SOC and with reference to formula (5). Formula (5) includes:

$$G_m = \sum_{n=1}^{N}(g_0(SOC_n) - g_1(SOC_n))^2 \quad \text{formula (5)}$$

N represents a quantity of SOCs, N is a positive integer not less than 2, and $G_n$ represents the $n^{th}$ overall dV/dSOC data deviation of the plurality of SOCs.

For example, $g_1(SOC)$ may be shown as formula (2), $g_0(SOC)$ may be shown as formula (4), and the following formula (6) can be obtained by substituting formula (2) and formula (4) into formula (5):

$$G_m = \sum_{n=1}^{N}(g_0(SOC_n) - g_1(SOC_n))^2 = \sum_{n=1}^{N}\left(\left(a_0 + \sum_{j=1}^{6}\binom{a_j*\sin(j*\omega*SOC_n)+}{b_j*\cos(j*\omega*SOC_n)}\right) - Q_m\left(\frac{dV}{dq}\right)_{SOC_n}\right)^2 \quad \text{formula (6)}$$

It can be learned that $G_m$ is related to $Q_m$. Table 1 provides a group of mapping relationships between $G_m$ and $Q_m$, as shown below:

TABLE 1

| Q | $Q_{EOL}$ | $Q_1$ | ... | ... | $Q_m$ | ... | $Q_{BOL}$ |
|---|---|---|---|---|---|---|---|
| G | $G_0$ | $G_1$ | ... | ... | $G_m$ | ... | $G_M$ |

$Q_{EOL}$ represents a full charge/full discharge capacity of the target battery at the end of life (EOL), and $Q_{BOL}$ represents a full charge/full discharge capacity of the target battery in the new battery state.

In step S303:

The apparatus for estimating a battery SOH may determine the smallest overall dV/dSOC data deviation from all the overall dV/dSOC data deviations in a sorting manner, or may determine the smallest overall dV/dSOC data deviation from all the overall dV/dSOC data deviations in another manner. This is not specifically limited in this embodiment of this application.

In step S304:

The apparatus for estimating a battery SOH determines the preset battery capacity corresponding to the smallest overall dV/dSOC data deviation as the retention capacity of the aged target battery. It can be learned from the foregoing descriptions that the dV/dSOC characteristic function that is of the target battery in the new state and that is obtained by charging or discharging the target battery based on the preset current in the new battery state may also be considered as the dV/dSOC characteristic function of the target battery at the different aging degrees. Therefore, theoretically, the preset battery capacity corresponding to the smallest overall dV/dSOC data deviation most approximates to an estimated capacity value of an actual retention capacity.

In step S305:

According to a definition of the SOH, the SOH of the target battery can be obtained only by dividing the retention capacity of the aged target battery by the retention capacity of the target battery in the new battery state.

In the method for estimating a battery SOH that is provided in this embodiment of this application, the apparatus for estimating a battery SOH obtains the partial charge or discharge capacity of the target battery in the SOC interval of each of the plurality of SOCs; separately calculates the first dV/dSOC data of each SOC in the $m^{th}$ preset battery capacity based on the $m^{th}$ preset battery capacity and the partial charge or discharge capacity in the SOC interval of each SOC; separately calculates, based on the prestored dV/dSOC characteristic function, the second dV/dSOC data corresponding to each SOC, where the dV/dSOC characteristic function is obtained by charging or discharging the target battery based on the preset current in the new battery state, the preset current is not greater than $\frac{1}{20} Q_{BOL}$, and $Q_{BOL}$ indicates the retention capacity of the target battery in the new battery state; calculates the $m^{th}$ overall dV/dSOC data deviation of the plurality of SOCs based on the first dV/dSOC data of each SOC in the $m^{th}$ preset battery capacity and the second dV/dSOC data corresponding to each SOC; determines the smallest overall dV/dSOC data deviation from all the overall dV/dSOC data deviations; determines the preset battery capacity corresponding to the smallest overall dV/dSOC data deviation as the retention capacity of the aged target battery; and determines the SOH of the target battery based on the retention capacity of the aged target battery. In other words, in this solution, the retention capacity of the aged target battery is estimated based on the partial charge or discharge capacity in the SOC interval of each SOC. In this way, this solution is unlike the prior art in which the parameter can be obtained only by performing one full charge or full discharge test, and therefore an implementation condition of this solution is simpler and more flexible. In addition, this solution does not need to rely on historical data, and therefore is more robust.

The actions of the apparatus for estimating a battery SOH in the foregoing steps S301 to S305 may be performed by the processor 2601 in the apparatus 26 for estimating a battery SOH that is shown in FIG. 2, by invoking the application program code stored in the memory 2603. This is not limited in this embodiment of this application.

The foregoing mainly describes the solutions provided in the embodiments of this application from a perspective that the apparatus for estimating a battery SOH performs the method for estimating a battery SOH. It may be understood that to implement the foregoing functions, the apparatus for estimating a battery SOH includes corresponding hardware structures and/or software modules for performing the functions. A person skilled in the art should be very easily aware that, with reference to the examples described in the embodiments disclosed in this specification, units and algorithm steps can be implemented in this application by hardware or a combination of hardware and computer software. Whether a function is implemented by hardware or by computer software by driving hardware depends on particular applications and design constraints of the technical solutions. A person skilled in the art may use different methods to implement the described functions for each particular application, but it should not be considered that the implementation goes beyond the scope of this application.

In the embodiments of this application, functional modules of the apparatus for estimating a battery SOH may be obtained through division based on the foregoing method examples. For example, each functional module may be obtained through division for each corresponding function, or two or more functions may be integrated into one processing module. The integrated module may be implemented in a form of hardware, or may be implemented in a form of a software function module. It should be noted that, in the embodiments of this application, module division is merely an example and is merely logical function division. During actual implementation, there may be another division manner.

Figure 8:
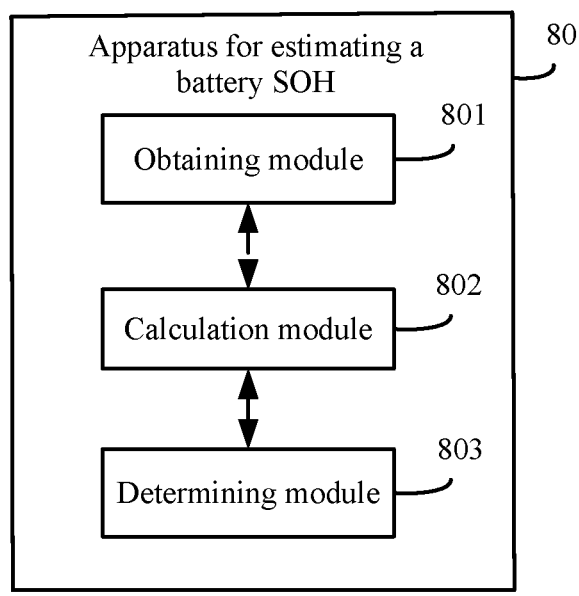
FIG. 8 is a schematic structural diagram of an apparatus for estimating a battery SOH according to an embodiment of this application.

For example, when each functional module is obtained through division for each corresponding function, FIG. 8 is a possible schematic structural diagram of an apparatus 80 for estimating a battery SOH in the foregoing embodiment. The apparatus 80 for estimating a battery SOH includes an obtaining module 801, a calculation module 802, and a determining module 803. The obtaining module 801 is configured to support the apparatus 80 for estimating a battery SOH in performing step S301 in FIG. 3. The calculation module 802 is configured to support the apparatus 80 for estimating a battery SOH in performing steps S302 and S305 in FIG. 3. The determining module 803 is configured to support the apparatus 80 for estimating a battery SOH in performing steps S303 and S304 in FIG. 3.

All related content of the steps in the foregoing method embodiment can be cited in function descriptions of corresponding functional modules, and details are not described herein.

Figure 9:
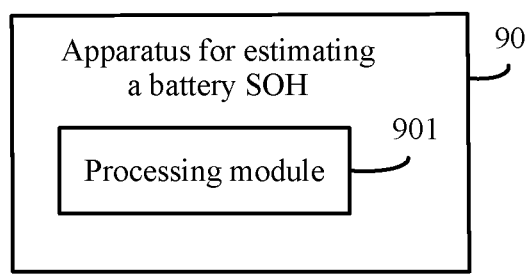
FIG. 9 is a schematic structural diagram of another apparatus for estimating a battery SOH according to an embodiment of this application.

When each functional module is obtained through division in an integration manner, FIG. 9 is a possible schematic structural diagram of an apparatus 90 for estimating a battery SOH in the foregoing embodiment. As shown in FIG. 9, the apparatus 90 for estimating a battery SOH includes a processing module 901. The processing module 901 is configured to support the apparatus 90 for estimating a battery SOH in performing steps S301 to S305 in FIG. 3.

All related content of the steps in the foregoing method embodiment can be cited in function descriptions of corresponding functional modules, and details are not described herein.

In the embodiments of this application, the apparatus for estimating a battery SOH is presented in a form that each functional module is obtained through division for each corresponding function, or the apparatus for estimating a battery SOH is presented in a form that each functional module is obtained through division in an integration manner. The "module" herein may be an application-specific integrated circuit (ASIC), a circuit, a processor that executes one or more software or firmware programs and a memory, an integrated logic circuit, and/or another component that can provide the foregoing functions. In a simple embodiment, a person skilled in the art may consider that the apparatus 80 for estimating a battery SOH or the apparatus 90 for estimating a battery SOH may use the form shown in FIG. 2. For example, the obtaining module 801, the calculation module 802, and the determining module 803 in FIG. 8 may be implemented by the processor 2601 and the memory 2603 in FIG. 2. Specifically, the obtaining module 801, the calculation module 802, and the determining module 803 may be implemented by the processor 2601 by invoking the application program code stored in the memory 2603. This is not limited in the embodiments of this application. Alternatively, for example, the processing module 901 in FIG. 9 may be implemented by the processor 2601 and the memory 2603 in FIG. 2. Specifically, the processing module 901 may be implemented by the processor 2601 by invoking the application program code stored in the memory 2603. This is not limited in the embodiments of this application.

Because the apparatus for estimating a battery SOH that is provided in the embodiments of this application may be configured to perform the foregoing method for estimating a battery SOH, for a technical effect that can be obtained by the apparatus for estimating a battery SOH, refer to the foregoing method embodiment. Details are not described herein again in the embodiments of this application.

All or some of the foregoing embodiments may be implemented by software, hardware, firmware, or any combination thereof. When a software program is used to implement the embodiments, all or some of the embodiments may be implemented in a form of a computer program product. The computer program product includes one or more computer instructions. When the computer program instructions are loaded and executed on a computer, all or some of the procedures or functions according to the embodiments of this application are generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (e.g., a coaxial cable, an optical fiber, or a digital subscriber line) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (e.g., a floppy disk, a hard disk, or a magnetic tape), an optical medium (e.g., a DVD), a semiconductor medium (e.g., a solid state disk), or the like.

Although this application is described herein with reference to the embodiments, in a process of implementing this application that claims protection, a person skilled in the art may understand and implement another variation of the disclosed embodiments by viewing the accompanying drawings, the disclosed content, and the appended claims. In the claims, "comprising" does not exclude another component or step, and "a" or "one" does not exclude a case of "a plurality of". A single processor or another unit may implement several functions enumerated in the claims. Some measures are recorded in appended claims that are different from each other, but this does not mean that these measures cannot be combined to produce a better effect.

Although this application is described with reference to specific features and the embodiments thereof, apparently, various modifications and combinations may be made to this application without departing from scope of this application. Correspondingly, the specification and accompanying drawings are merely example descriptions of this application defined by the appended claims, and are considered to cover any of or all modifications, variations, combinations, or equivalents within the scope of this application. Apparently, a person skilled in the art can make various modifications and variations to this application without departing from the spirit and scope of this application. In this way, this application is intended to cover these modifications and variations of this application provided that they fall within the scope of the claims of this application and equivalent technologies thereof.

What is claimed is:

1. A method for estimating a battery state of health (SOH), wherein the method comprises:

obtaining N states of charge (SOCs) of a target battery in N states, where each one of the N SOCs is a ratio of a remaining capacity of the target battery to a full charge capacity of the target battery;

calculating first dV/dSOC data of each SOC in an $n^{th}$ SOC based on a charge/discharge capacity of the target battery in the $n^{th}$ SOC and an $m^{th}$ preset capacity of the battery, wherein N represents a quantity of SOCs, N is a positive integer not less than 2, n is a positive integer less than or equal to N, m is a positive integer from 1 to M, and M is a quantity of preset capacities;

separately calculating, based on a dV/dSOC-SOC characteristic function, second dV/dSOC data corresponding to each SOC, wherein the dV/dSOC-SOC characteristic function is obtained by charging or discharging the target battery based on a preset current in a new battery state, the preset current is not greater than $\frac{1}{20} Q_{BOL}$, and $Q_{BOL}$ indicates a retention capacity of the target battery in the new battery state;

obtaining an $m^{th}$ overall dV/dSOC data deviation of the plurality of SOCs through calculation based on the first dV/dSOC data of each SOC in the $m^{th}$ preset battery capacity and the second dV/dSOC data corresponding to each SOC;

determining a smallest overall dV/dSOC data deviation from M overall dV/dSOC data deviations;

determining a preset battery capacity corresponding to the smallest overall dV/dSOC data deviation as a retention capacity of an aged target battery; and obtaining an SOH of the target battery through calculation based on the retention capacity of the aged target battery.

2. The method according to claim 1, wherein the method further comprises:

obtaining a partial charge or discharge capacity of the target battery in a SOC interval of each SOC in the $n^{th}$ SOC, wherein the SOC interval of each SOC is an interval whose start SOC is the SOC and whose length is dSOC, and the charge/discharge capacity in the $n^{th}$ SOC is a partial charge or discharge capacity in the interval.

3. The method according to claim 2, wherein the obtaining a partial charge or discharge capacity of the target battery in a SOC interval of each SOC in the $n^{th}$ SOC comprises:

obtaining the partial charge or discharge capacity of the target battery in the SOC interval of each of the plurality of SOCs with reference to the following first preset formula, wherein the first preset formula comprises:

$$q_{SOC_n} = \eta \int_{SOC_n-t_{start}}^{SOC_n-t_{end}} i(t)_{SOC_n} dt,$$

wherein $SOC_n$ represents the $n^{th}$ SOC, $q_{SOC_n}$ represents a partial charge or discharge capacity in a SOC interval of $SOC_n$, $\eta$ is coulombic efficiency of the target battery, $0<\eta\leq 1$, $SOC_n-t_{start}$ represents a start moment of the SOC interval of $SOC_n$, $SOC_n-t_{end}$ represents an end moment of the SOC interval of $SOC_n$, and $i(t)_{SOC_n}$ represents a random current in the SOC interval of $SOC_n$.

4. The method according to claim 1, wherein the obtaining an SOH of the target battery through calculation based on the retention capacity of the aged target battery comprises: dividing the retention capacity of the aged target battery by the retention capacity of the target battery in the new battery state, to obtain the SOH of the target battery.

5. The method according to claim 1, wherein the separately calculating first dV/dSOC data of each SOC in an $n^{th}$ SOC based on a charge/discharge capacity of the target battery in the $n^{th}$ SOC and an $m^{th}$ preset capacity of the battery comprises:
separately calculating the first dV/dSOC data of each SOC in the $m^{th}$ preset battery capacity based on the $m^{th}$ preset battery capacity and the partial charge or discharge capacity in the SOC interval of each SOC and with reference to a second preset formula, wherein the second preset formula comprises:

$$g_1(SOC_n) = Q_m\left(\frac{dV}{dq}\right)_{SOC_n},$$

wherein $Q_m$ represents the $m^{th}$ preset battery capacity, $SOC_n$ represents the $n^{th}$ SOC, $g_1(SOC_n)$ represents first dV/dSOC data of $SOC_n$ in the $m^{th}$ preset battery capacity, V represents a voltage, q represents a partial charge or discharge capacity, and $$\left(\frac{dV}{dq}\right)_{SOC_n}$$

represents $$\frac{dV}{dq}$$

corresponding to $SOC_n$.

6. The method according to claim 5, wherein when the target battery works in a discharge state, the second preset formula specifically comprises:

$$g_1(SOC_n) = Q_m\left(\frac{dV}{dq}\right)_{SOC_n} = Q_m\frac{OCV_{SOC_n-t_{end}} - OCV_{SOC_n-t_{start}}}{q'_{SOC_n}},$$

wherein $SOC_n-t_{start}$ represents the start moment of the SOC interval of $SOC_n$, $SOC_n-t_{end}$ represents the end moment of the SOC interval of $SOC_n$, $OCV_{SOC_n-t_{start}}$ represents an open circuit voltage (OCV) at $SOC_n-t_{start}$, $OCV_{SOC_n-t_{end}}$ represents an OCV at $SOC_n-t_{end}$, and $q'_{SOC_n}$ represents a partial discharge capacity in the SOC interval of $SOC_n$.

7. The method according to claim 1, wherein the dV/dSOC-SOC characteristic function comprises:

$$g_0(SOC_n) = a_0 + \sum_{j=1}^{6}(a_j * \sin(j*\omega*SOC_n) + b_j*\cos(j*\omega*SOC_n)),$$

wherein $SOC_n$ represents the $n^{th}$ SOC, $SOC_n$ is an independent variable of the dV/dSOC-SOC characteristic function, $g_0(SOC_n)$ represents second dV/dSOC data corresponding to $SOC_n$, j represents an order, $a_0$, $a_j$, and $b_j$ are coefficients of terms, sin( ) represents a sine function, cos( ) represents a cosine function, and $\omega$ represents frequency.

8. The method according to claim 1, wherein the calculating an $m^{th}$ overall dV/dSOC data deviation of the plurality of SOCs based on the first dV/dSOC data of each SOC in the $m^{th}$ preset battery capacity and the second dV/dSOC data corresponding to each SOC comprises:
calculating the $m^{th}$ overall dV/dSOC data deviation of the plurality of SOCs based on the first dV/dSOC data of each SOC in the $m^{th}$ preset battery capacity and the second dV/dSOC data corresponding to each SOC and with reference to a third preset formula, wherein the third preset formula comprises:

$$G_m = \sum_{n=1}^{N}(g_0(SOC_n) - g_1(SOC_n))^2,$$

wherein N represents the quantity of SOCs, N is a positive integer not less than 2, $SOC_n$ represents the $n^{th}$ SOC, $g_0(SOC_n)$ represents the second dV/dSOC data corresponding to $SOC_n$, $g_1(SOC_n)$ represents the first dV/dSOC data of $SOC_n$ in the $m^{th}$ preset battery capacity, and $G_m$ represents the $m^{th}$ overall dV/dSOC data deviation of the plurality of SOCs.

9. An apparatus for estimating a battery state of health SOH, wherein the apparatus comprises an obtaining module and a calculation module, wherein
the obtaining module is configured to obtain N states of charge SOCs of a target battery in N states, wherein the SOC is a ratio of a remaining capacity of the target battery to a full charge capacity of the target battery; and
the calculation module is configured to:
separately calculate first dV/dSOC data of each SOC in an $n^{th}$ SOC based on a charge/discharge capacity of the target battery in the $n^{th}$ SOC and an $m^{th}$ preset capacity of the battery, wherein N represents a quantity of SOCs, N is a positive integer not less than 2, n is a positive integer less than or equal to N, m is a positive integer from 1 to M, and M is a quantity of preset capacities;
separately calculate, based on a dV/dSOC-SOC characteristic function, second dV/dSOC data corresponding to each SOC, wherein the dV/dSOC-SOC characteristic function is obtained by charging or discharging the target battery based on a preset current in an new battery state, the preset current is not greater than $1/20\ Q_{BOL}$, and $Q_{BOL}$ indicates a retention capacity of the target battery in the new battery state;

obtain an $m^{th}$ overall dV/dSOC data deviation of the plurality of SOCs through calculation based on the first dV/dSOC data of each SOC in the $m^{th}$ preset battery capacity and the second dV/dSOC data corresponding to each SOC;

determine a smallest overall dV/dSOC data deviation from M overall dV/dSOC data deviations;

determine a preset battery capacity corresponding to the smallest overall dV/dSOC data deviation as a retention capacity of an aged target battery; and obtain an SOH of the target battery through calculation based on the retention capacity of the aged target battery.

10. The apparatus according to claim 9, wherein the obtaining module is further configured to obtain a partial charge or discharge capacity of the target battery in a SOC interval of each SOC in the $n^{th}$ SOC, wherein the SOC interval of each SOC is an interval whose start SOC is the SOC and whose length is dSOC, and the charge/discharge capacity in the $n^{th}$ SOC is a partial charge or discharge capacity in the interval.

11. The apparatus according to claim 10, wherein the obtaining module is specifically configured to:

obtain the partial charge or discharge capacity of the target battery in the SOC interval of each of the plurality of SOCs with reference to the following first preset formula, wherein the first preset formula comprises:

$$q_{SOC_n} = \eta \int_{SOC_n-t_{start}}^{SOC_n-t_{end}} i(t)_{SOC_n} dt,$$

wherein $SOC_n$ represents the $n^{th}$ SOC, $q_{SOC_n}$ represents a partial charge or discharge capacity in a SOC interval of $SOC_n$, $\eta$ is coulombic efficiency of the target battery, $0 < \eta \leq 1$, $SOC_n-t_{start}$ represents a start moment of the SOC interval of $SOC_n$, $SOC_n-t_{end}$ represents an end moment of the SOC interval of $SOC_n$, and $i(t)_{SOC_n}$ represents a random current in the SOC interval of $SOC_n$.

12. The apparatus according to claim 9, wherein the calculation module is specifically configured to divide the retention capacity of the aged target battery by the retention capacity of the target battery in the new battery state, to obtain the SOH of the target battery.

13. The apparatus according to claim 9, wherein the calculation module is specifically configured to:

separately calculate the first dV/dSOC data of each SOC in the $m^{th}$ preset battery capacity based on the $m^{th}$ preset battery capacity and the partial charge or discharge capacity in the SOC interval of each SOC and with reference to a second preset formula, wherein the second preset formula comprises:

$$g_1(SOC_n) = Q_m \left(\frac{dV}{dq}\right)_{SOC_n},$$

wherein $Q_m$ represents the $m^{th}$ preset battery capacity, $SOC_n$ represents the $n^{th}$ SOC, $g_1(SOC_n)$ represents first dV/dSOC data of $SOC_n$ in the $m^{th}$ preset battery capacity, V represents a voltage, q represents a partial charge or discharge capacity, and $$\left(\frac{dV}{dq}\right)_{SOC_n}$$

represents $$\frac{dV}{dq}$$

corresponding to $SOC_n$.

14. The apparatus according to claim 13, wherein when the target battery works in a discharge state, the second preset formula specifically comprises:

$$g_1(SOC_n) = Q_m\left(\frac{dV}{dq}\right)_{SOC_n} = Q_m \frac{OCV_{SOC_n-t_{end}} - OCV_{SOC_n-t_{start}}}{q'_{SOC_n}},$$

wherein $SOC_n-t_{start}$ represents the start moment of the SOC interval of $SOC_n$, $SOC_n-t_{end}$ represents the end moment of the SOC interval of $SOC_n$, $OCV_{SOC_n-t_{end}}$ represents an open circuit voltage (OCV) at $SOC_n-t_{start}$, $OCV_{SOC_n-t_{start}}$ represents an OCV at $SOC_n-t_{end}$, and $q'_{SOC_n}$ represents a partial discharge capacity in the SOC interval of $SOC_n$.

15. The apparatus according to claim 9, wherein the dV/dSOC-SOC characteristic function comprises:

$$g_0(SOC_n) = a_0 + \sum_{j=1}^{6}(a_j * \sin(j*\omega*SOC_n) + b_j * \cos(j*\omega*SOC_n)),$$

wherein $SOC_n$ represents the $n^{th}$ SOC, $SOC_n$ is an independent variable of the dV/dSOC-SOC characteristic function, $g_0(SOC_n)$ represents second dV/dSOC data corresponding to $SOC_n$, j represents an order, $a_0$, $a_j$, and $b_j$ are coefficients of terms, sin( ) represents a sine function, cos( ) represents a cosine function, and w represents frequency.

16. The apparatus according to claim 9, wherein the calculation module is specifically configured to:

calculate the $m^{th}$ overall dV/dSOC data deviation of the plurality of SOCs based on the first dV/dSOC data of each SOC in the $m^{th}$ preset battery capacity and the second dV/dSOC data corresponding to each SOC and with reference to a third preset formula, wherein the third preset formula comprises:

$$G_m = \sum_{n=1}^{N}(g_0(SOC_n) - g_1(SOC_n))^2,$$

wherein N represents the quantity of SOCs, N is a positive integer not less than 2, $SOC_n$ represents the $n^{th}$ SOC, $g_0(SOC_n)$ represents the second dV/dSOC data corresponding to $SOC_n$, $g_1(SOC_n)$ represents the first dV/dSOC data of $SOC_n$ in the $m^{th}$ preset battery capacity, and $G_m$ represents the $m^{th}$ overall dV/dSOC data deviation of the plurality of SOCs.

* * * * *